(12) United States Patent
Komaki

(10) Patent No.: US 12,252,081 B2
(45) Date of Patent: Mar. 18, 2025

(54) ELECTRICAL CONNECTION BOX

(71) Applicant: Sumitomo Wiring Systems, Ltd., Yokkaichi (JP)

(72) Inventor: Kazuya Komaki, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 376 days.

(21) Appl. No.: 17/907,050

(22) PCT Filed: Mar. 5, 2021

(86) PCT No.: PCT/JP2021/008651
§ 371 (c)(1),
(2) Date: Sep. 22, 2022

(87) PCT Pub. No.: WO2021/192919
PCT Pub. Date: Sep. 30, 2021

(65) Prior Publication Data
US 2023/0123936 A1    Apr. 20, 2023

(30) Foreign Application Priority Data
Mar. 24, 2020  (JP) .................. 2020-052900

(51) Int. Cl.
| | |
|---|---|
| *B60R 16/023* | (2006.01) |
| *H01H 45/02* | (2006.01) |
| *H01H 45/12* | (2006.01) |
| *H02G 3/16* | (2006.01) |
| *H05K 7/20* | (2006.01) |

(52) U.S. Cl.
CPC ......... *B60R 16/0239* (2013.01); *H01H 45/02* (2013.01); *H01H 45/12* (2013.01); *H02G 3/16* (2013.01); *H05K 7/20854* (2013.01)

(58) Field of Classification Search
CPC .... B60R 16/0239; H01H 45/02; H01H 45/12; H02G 3/16; H05K 7/20854
USPC ........................................... 439/76.2
See application file for complete search history.

(56) References Cited

U.S. PATENT DOCUMENTS

| | | | |
|---|---|---|---|
| 2018/0105610 A1 | 4/2018 | Dusankova et al. | |
| 2019/0075678 A1* | 3/2019 | Aragones Carrete | ....................... H02S 40/345 |
| 2019/0318892 A1* | 10/2019 | Ikejiri | ............... H01M 10/6553 |

FOREIGN PATENT DOCUMENTS

| | | | | |
|---|---|---|---|---|
| DE | 102004056466 A1 * | 7/2005 | ......... | B60R 16/0239 |
| JP | 2002-176279 A | 6/2002 | | |
| JP | 2014-079093 A | 5/2014 | | |

(Continued)

OTHER PUBLICATIONS

International Search Report, Application No. PCT/JP2021/008651, mailed May 18, 2021.

*Primary Examiner* — Gary F Paumen
(74) *Attorney, Agent, or Firm* — Honigman LLP

(57) ABSTRACT

Provided is an electrical connection box including a housing casing for housing a relay, and a heat transfer sheet for transferring heat from the relay to the housing casing, the electrical connection box including: a bus bar provided between a top surface and an inside surface that correspond to each other in the housing casing so as to oppose the top surface and the inside surface; a first holding portion protruding from the inside surface and holding the bus bar via the heat transfer sheet; and a second holding portion protruding from the top surface and holding the bus bar.

11 Claims, 10 Drawing Sheets

(56) References Cited

FOREIGN PATENT DOCUMENTS

WO       2016-104110 A1    6/2016
WO   WO-2019163528 A1 *   8/2019   ......... B60R 16/0238

* cited by examiner

ELECTRICAL CONNECTION BOX

CROSS-REFERENCE TO RELATED APPLICATIONS

This application is the U.S. national stage of PCT/JP2021/008651 filed on Mar. 5, 2021, which claims priority of Japanese Patent Application No. JP 2020-052900 filed on Mar. 24, 2020, the contents of which are incorporated herein.

TECHNICAL FIELD

The present disclosure relates to an electrical connection box that houses an electronic component.

BACKGROUND

Conventionally, an electrical connection box that houses an electronic component such as a relay is installed in a vehicle.

JP 2014-79093A discloses a power supply apparatus provided with a relay including an openable/closable contact and an exciting coil that opens and closes the contact, and in which, by providing a bus bar that is electrically connected to the contact of the relay with a heat dissipation mechanism, the bus bar can be used as both a current path and a heat dissipation path.

In the power supply apparatus disclosed in JP 2014-79093A, a portion of a bus bar connected to an electronic component (relay) is in contact with a chassis (casing) via a heat transfer sheet, and heat generated by the electronic component is transferred to the chassis via the bus bar and the heat transfer sheet and dissipated.

On the other hand, if heat transferred via the bus bar concentrates at a portion of the chassis, warping may occur in the chassis due to a temperature difference between the portion where heat is concentrated and other portions of the chassis. The chassis may warp during a manufacturing process as well. In such a case, contact between the chassis and the heat transfer sheet is degraded, and heat generated by the electronic component will cease to be properly dissipated.

However, this issue is not taken into consideration in the power supply apparatus disclosed in JP 2014-79093A and thus is not resolved.

Thus, an object is to provide an electrical connection box that can suppress warping of a housing casing that houses an electronic component, and can ensure contact between a heat transfer sheet and the casing.

SUMMARY

An aspect of an electrical connection box according to one aspect of the present disclosure is an electrical connection box including a housing casing for housing an electronic component, and a heat transfer sheet for transferring heat from the electronic component to the housing casing, the electrical connection box including: a bus bar provided between two opposing surfaces of the housing casing so as to oppose the two surfaces; a first holding portion protruding from a first surface of the two surfaces, and holding the bus bar via the heat transfer sheet; and a second holding portion protruding from a second surface of the two surfaces, and holding the bus bar.

Advantageous Effects of the Present Disclosure

According to an aspect of the present disclosure, warping of a housing casing that houses an electric component can be suppressed, and contact between a heat transfer sheet and the casing can be ensured.

DETAILED DESCRIPTION OF PREFERRED EMBODIMENT

Figure 1:
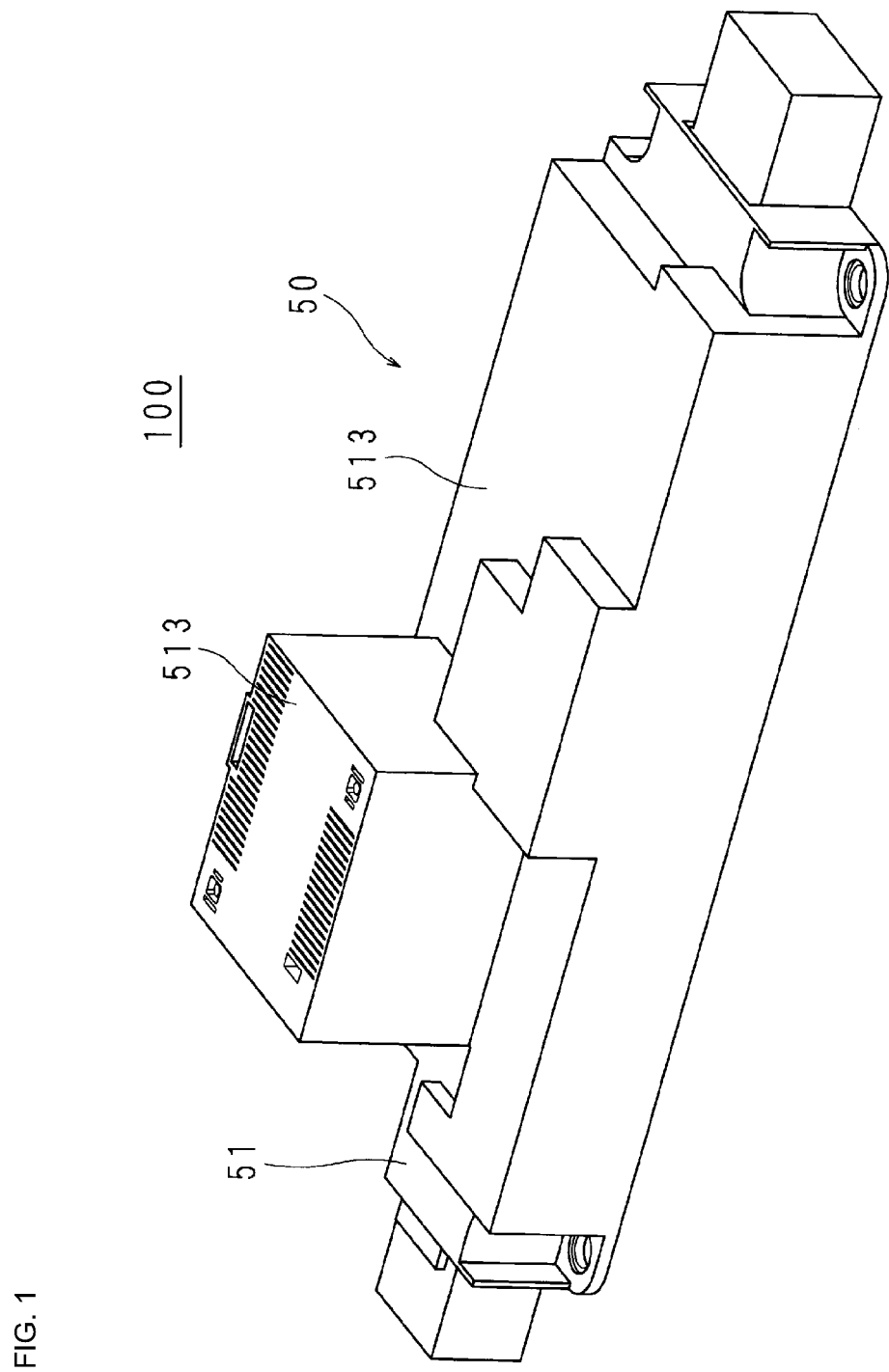
FIG. 1 is a perspective view showing an electrical connection box according to the Embodiment 1.

First, aspects of the present disclosure will be listed and described below. Also, at least some of the following aspects may be combined as appropriate.

First Aspect

A first aspect of an electrical connection box according to the present disclosure is an electrical connection box including a housing casing for housing an electronic component, and a heat transfer sheet for transferring heat from the electronic component to the housing casing, the electrical connection box including: a bus bar provided between two opposing surfaces of the housing casing so as to oppose the two surfaces; a first holding portion protruding from a first surface of the two surfaces, and holding the bus bar via the heat transfer sheet; and a second holding portion protruding from a second surface of the two surfaces, and holding the bus bar.

In the first aspect, the first holding portion holds the bus bar from one surface side of the bus bar via the heat transfer sheet, and the second holding portion holds the bus bar from the other surface side on the side opposite to the one surface. Accordingly, the force of the second holding portion restraining the bus bar is transferred to the first surface via the bus bar and the first holding portion, and warping of the first surface can be suppressed.

Second Aspect

In an electrical connection box according to a second aspect of the present disclosure, the electrical component is connected to the bus bar, and is attached to the second surface at a position corresponding to the first holding portion in an opposing direction in which the two surfaces oppose each other.

In second aspect, the electronic component is attached to the second surface, and provided at a position that corresponds to the first holding portion in an opposing direction in which the two surfaces oppose each other. Accordingly, the force of the electrical component restraining the bus bar is transferred to the first surface via the first holding portion, and warping of the first surface can be suppressed.

Third Aspect

In an electrical connection box according to a third aspect of the present disclosure, the first holding portion and the second holding portion are provided at positions corresponding to each other in the opposing direction.

In the third aspect, the first holding portion and the second holding portion are provided at positions that correspond to each other in the opposing direction and both push against the bus bar, and thus the force of the second holding portion restraining the bus bar can be easily transmitted to the first surface via the bus bar and the first holding portion, and thus warping of the first surface can be efficiently suppressed.

Fourth Aspect

In an electrical connection box according to a fourth aspect of the present disclosure, the electronic component has a box shape and is provided with a terminal on one surface thereof, and the one surface intersects the first surface.

In fourth aspect, the terminal is provided not on the opposing surface that opposes the first surface but on the one surface of the electrical component that intersects the first surface. Accordingly, there is no need to form a hole or the like for connection to the terminal of the electronic component in a portion of the bus bar that faces the opposing surface of the electronic component, that is, an interposed portion that is interposed between the electronic component and the first surface. Thus, a flat portion of the interposed portion of the bus bar can be maximized, and the interposed portion can evenly restrain the first surface via the first holding portion.

Fifth Aspect

In an electrical connection box according to a fifth aspect of the present disclosure, the heat transfer sheet is made of one of graphite and aluminum.

In the fifth aspect, the heat transfer sheet is made of a material that is not prone to deform such as graphite or aluminum. Accordingly, the force with which the bus bar restrains the first surface via the heat transfer sheet is swiftly and reliably transferred to the first surface, and thus warping thereof can be more reliably suppressed.

Sixth Aspect

In an electrical connection box according to a sixth aspect of the present disclosure, the electrical connection box further includes a deformable heat transfer member provided in a vicinity of the first holding portion and in contact with the heat transfer sheet and the first surface.

In the sixth aspect, the heat transfer member is in contact with the heat transfer sheet and the first surface, and is deformable. Accordingly, by using a heat transfer member that has a thickness slightly greater than the distance between the heat transfer sheet and the first surface, the heat transfer member can be in constant contact with the heat transfer sheet and the first surface. Thus, heat generated by the electronic component is transferred to the first surface by the heat transfer member as well as by the first holding portion, and thus heat can be more efficiently dissipated.

The present disclosure will be described in detail based on drawings illustrating the embodiments thereof. Specific examples of an electrical connection box according to embodiments of the present disclosure will be described below with reference to the drawings. Note that the present disclosure is not limited to these illustrative examples, but is indicated by the claims, and all changes that come within the meaning and range of equivalency of the claims are intended to be embraced therein.

The present embodiment will be described below using, as an example, an electrical connection box that houses, for example, a relay serving as an electronic component.

Embodiment 1

FIG. 1 is a perspective view showing an electrical connection box 100 according to Embodiment 1. The electrical connection box 100 includes a housing casing 50 that houses an electronic component. The housing casing 50 houses a later-described relay 10, for example. Also, the housing casing 50 is constituted by an upper case 51 to which the relay 10 is fixed, and a later-described lower case 52 that is covered by the upper case 51.

Figure 2:
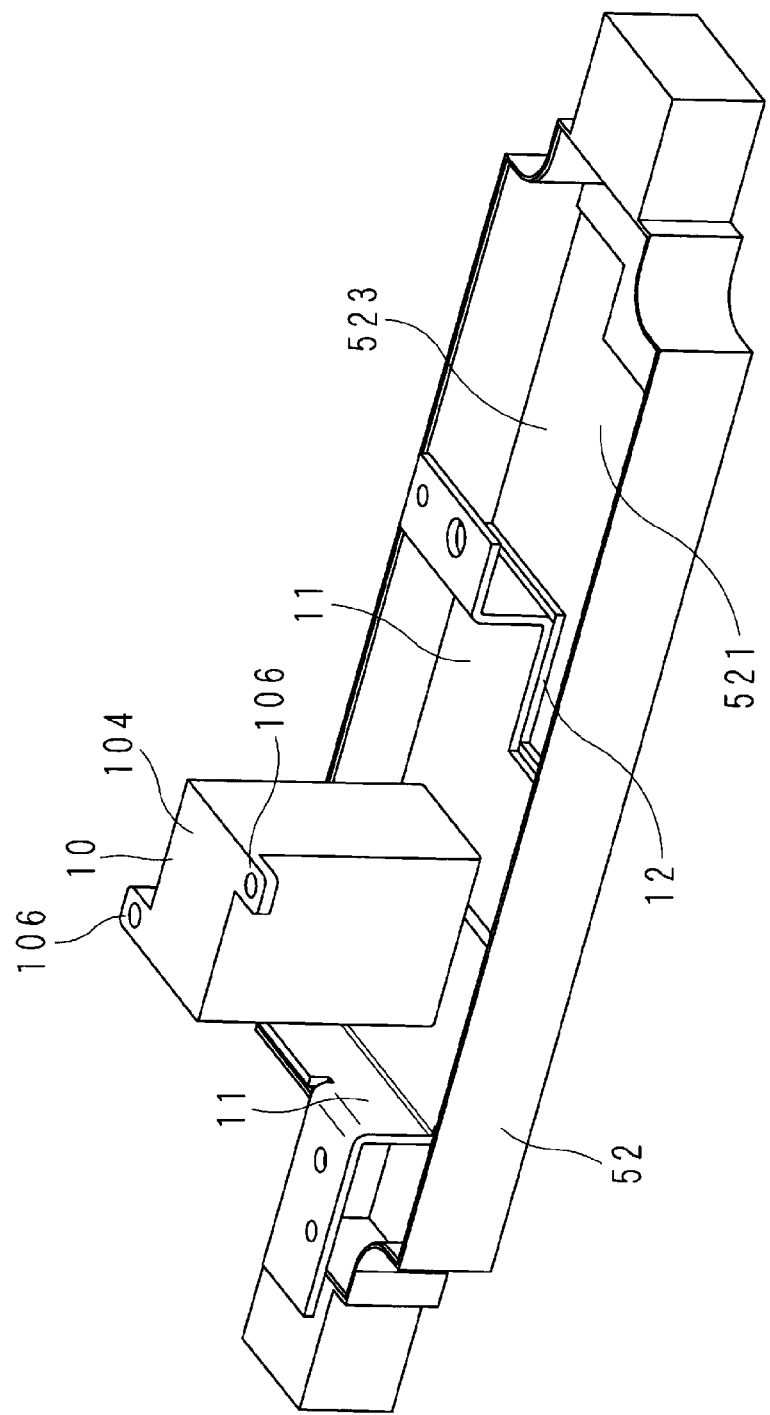
FIG. 2 is a perspective view showing the electrical connection box according to Embodiment 1, without an upper case.

FIG. 2 is a perspective view showing the electrical connection box 100 according to Embodiment 1, without the upper case 51. The relay 10 is turned on when the vehicle is made to travel, and is turned off when the vehicle is not to made to travel, for example.

The electrical connection box 100 is attached to the outside of a battery pack of an electric vehicle (EV), for example. In other words, the electrical connection box 100 according to the present embodiment is attached such that a bottom plate 521 of the lower case 52 is in contact with the battery pack.

Figure 6:
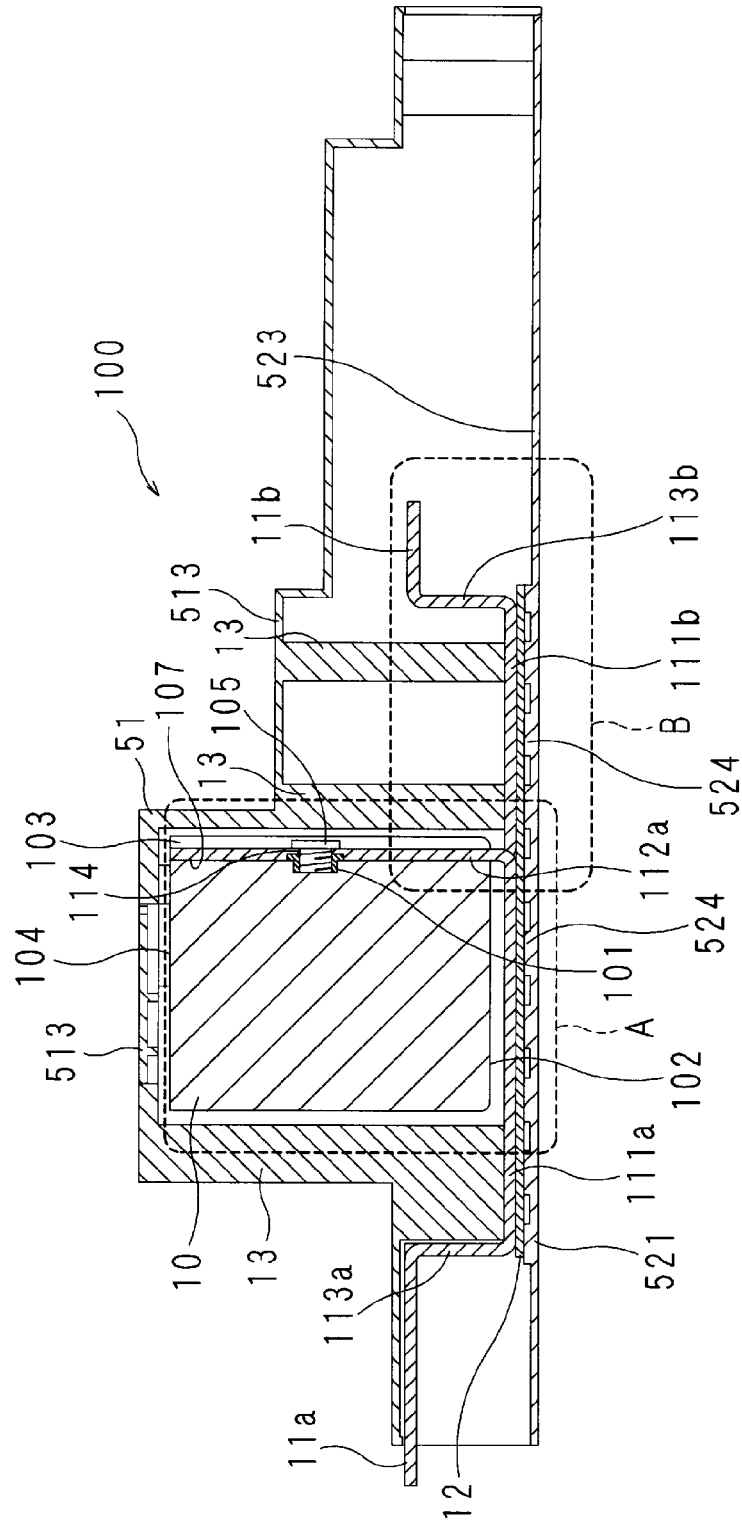
FIG. 6 is a cross-sectional view taken along a line VI-VI in FIG. 4.

A heat transfer sheet 12 is placed on an inside surface 523 (first surface) of the bottom plate 521 of the lower case 52 with one surface of the heat transfer sheet 12 opposing the inside surface 523 of the bottom plate 521, and a bus bar 11 is provided on the other surface side of the heat transfer sheet 12 (see FIG. 6). The bus bar 11 is in contact with the other surface of the heat transfer sheet 12. In other words, the heat transfer sheet 12 is interposed between the inside surface 523 and the bus bar 11.

Figure 3:
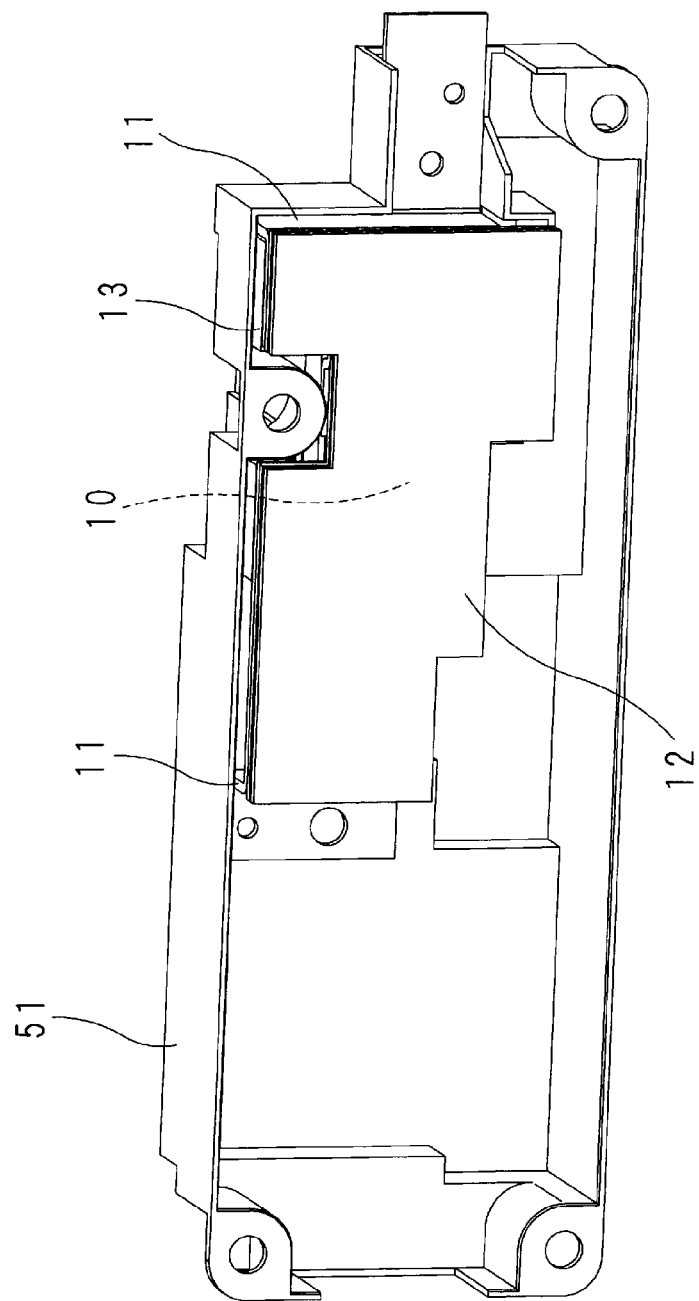
FIG. 3 is a diagram showing the inside of a housing casing of the electrical connection box according to Embodiment 1, without a lower case.
Figure 4:
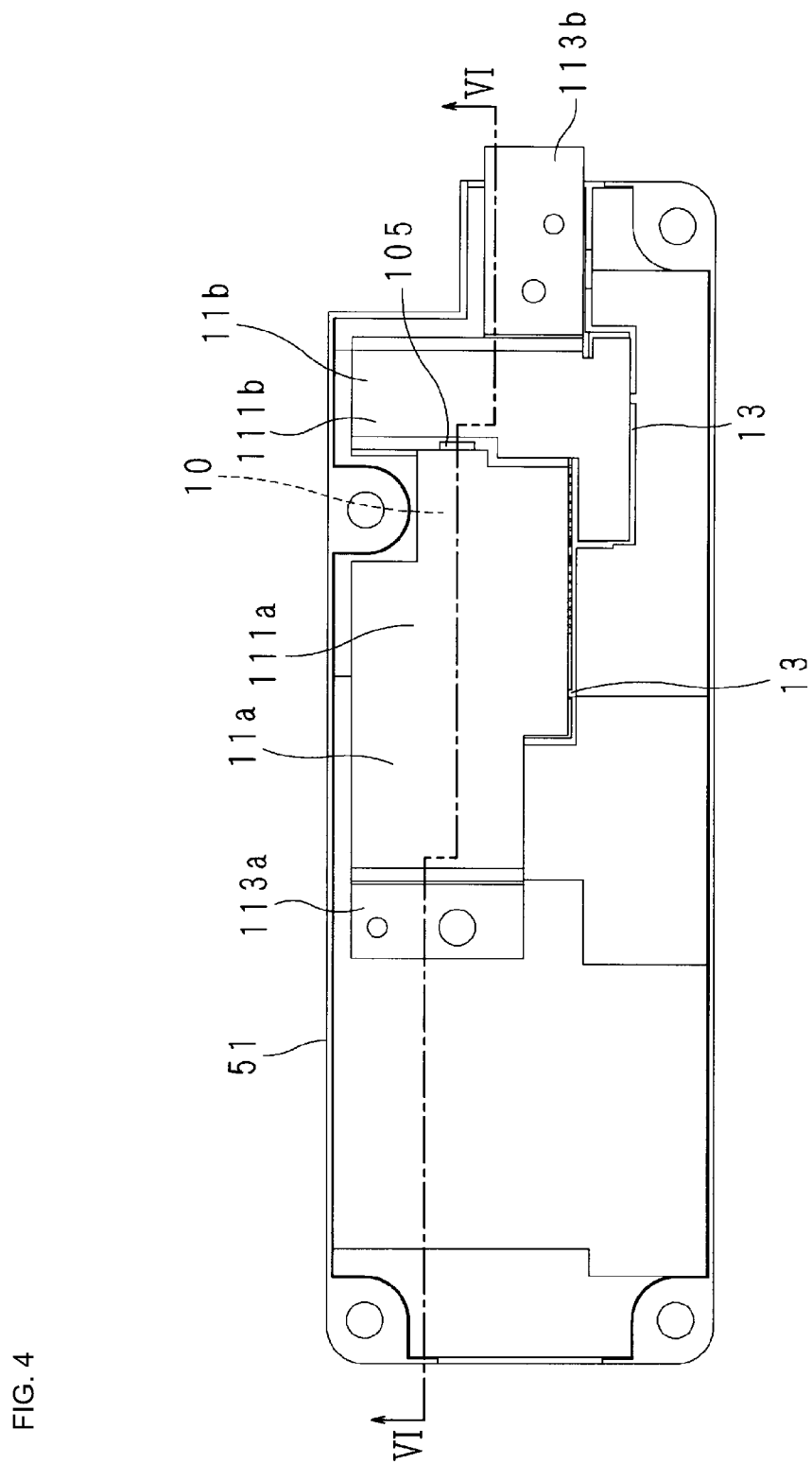
FIG. 4 is a diagram showing the inside of the housing casing of the electrical connection box according to Embodiment 1, without the lower case and a heat transfer sheet.
Figure 5:
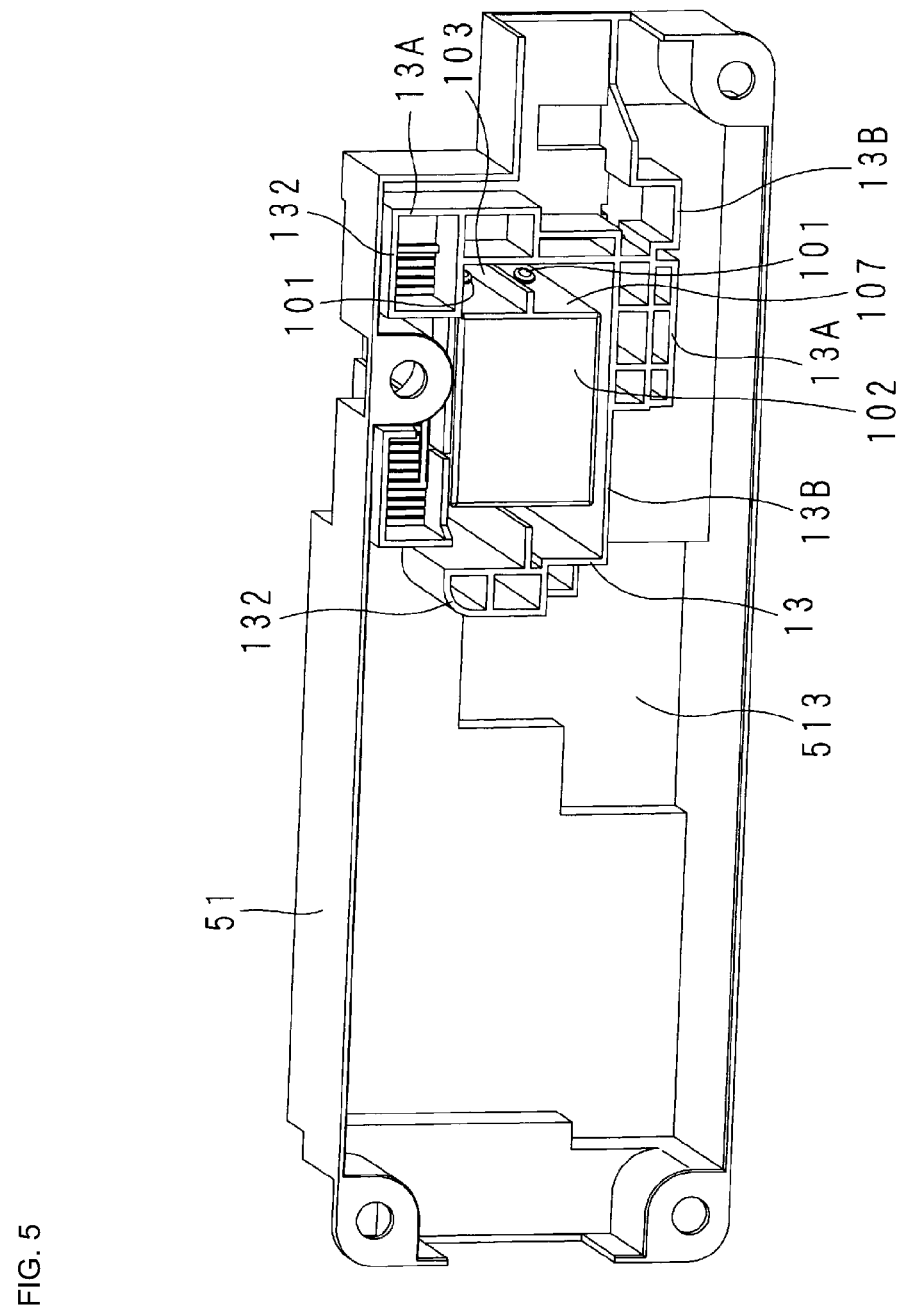
FIG. 5 is a diagram showing the inside of the housing casing of the electrical connection box according to Embodiment 1, without the lower case, the heat transfer sheet, and a bus bar.

FIG. 3 is a diagram showing the inside of the housing casing 50 of the electrical connection box 100 according to Embodiment 1, without the lower case 52. FIG. 4 is a diagram showing the inside of the housing casing 50 of the electrical connection box 100 according to Embodiment 1, without the lower case 52 and the heat transfer sheet 12. FIG. 5 is a diagram showing the inside of the housing casing 50 of the electrical connection box 100 according to Embodiment 1, without the lower case 52, the heat transfer sheet 12, and the bus bar 11.

Also, FIG. 6 is a cross-sectional view taken along line VI-VI in FIG. 4. FIGS. 3 to 5 show the positional relation between the relay 10, the bus bar 11, and the heat transfer sheet 12.

The relay 10 has a rectangular parallelepiped box shape, and one surface 102 thereof is provided so as to oppose the bus bar 11 (inside surface 523 of the lower case 52). The relay 10 has two terminals 101 that are connected to the bus bar 11. In the relay 10, the two terminals 101 are provided on one side surface 107 of four side surfaces of the relay 10 that respectively stand perpendicular from four edges of the one surface 102.

In other words, the relay 10 is provided such that the one surface 102 opposes the inside surface 523 (bus bar 11), and the side surface 107 intersects the inner-side surface 523.

The terminals 101 each have a cylindrical shape, and are mostly embedded in the relay 10 with only one end portion thereof exposed on the side surface 107. Threading is formed on the inner surface of each terminal 101 for screwing a later-described bolt 105 to the terminal 101 (see FIGS. 6 and 7).

Also, a partition plate 103 standing upright on the side surface 107 is provided between the two terminals 101 on the side surface 107 of the relay 10. The partition plate 103 has a substantially strip shape, and the two terminals 101 are partitioned by the partition plate 103.

In the relay 10, two extension pieces 106 are provided on another surface 104 that is on the side opposite to the one surface 102 (see FIG. 2). The extension pieces 106 are respectively continuous with two opposing edges of the other surface 104. The two extension pieces 106 are provided diagonally opposite to each other, and extend from the corresponding edges of the other surface 104. Each extension piece 106 is provided with a through hole that extends through the extension piece 106 in a direction in which the one surface 102 and the other surface 104 oppose each other. The relay 10 is fixed to the upper case 51 by inserting bolts (not shown) through the through holes, and screwing the bolts to bolt holes provided in a top surface 513 (second surface) of the upper case 51, for example.

The bus bar 11 is formed using a highly conductive metal plate, for example. Of the two terminals 101 of the relay 10, one terminal 101 is connected to a bus bar 11a, and the other terminal 101 is connected to a bus bar 11b.

Figure 7:
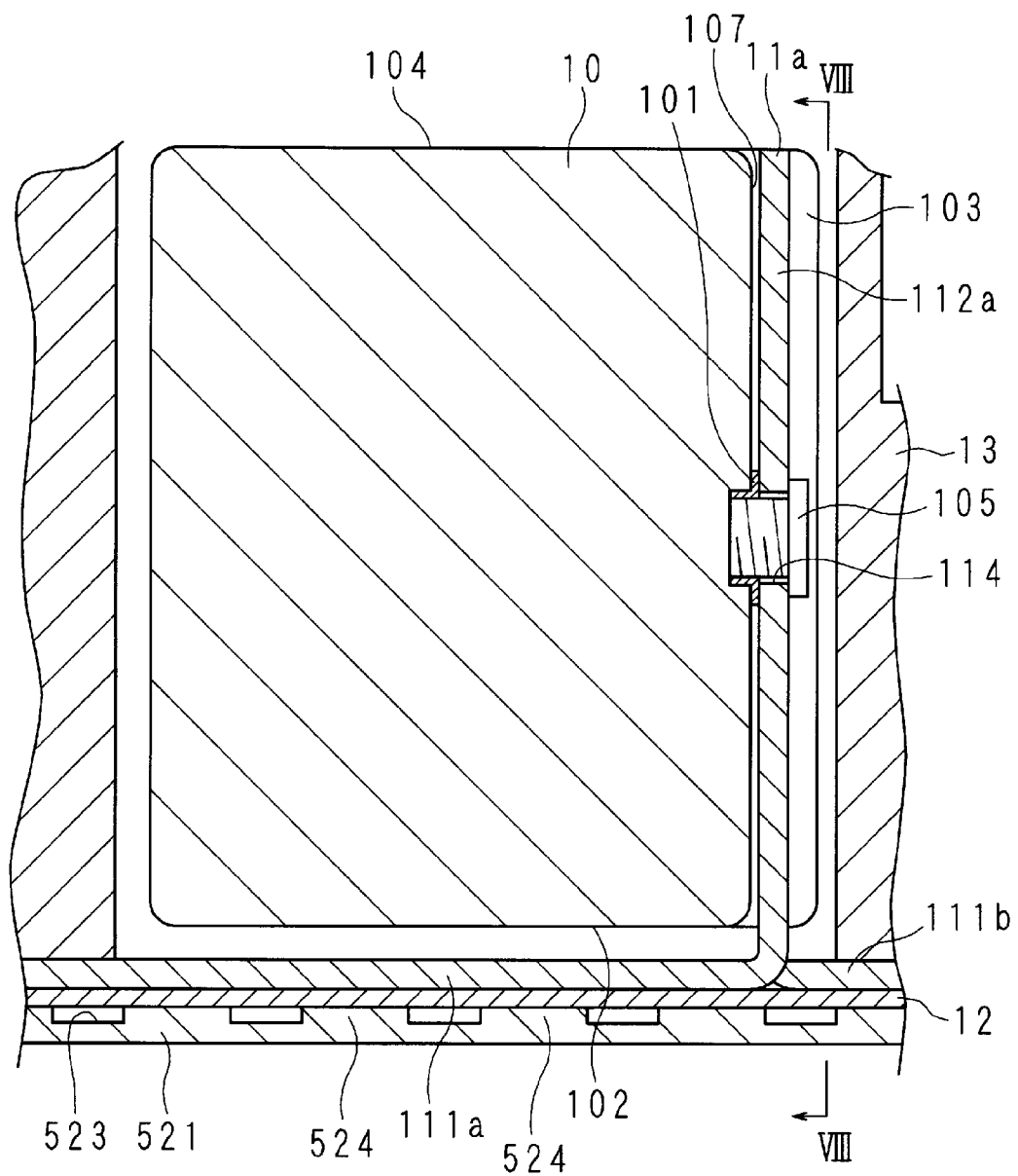
FIG. 7 is an enlarged view of a round A portion marked with a broken line in FIG. 6.
Figure 8:
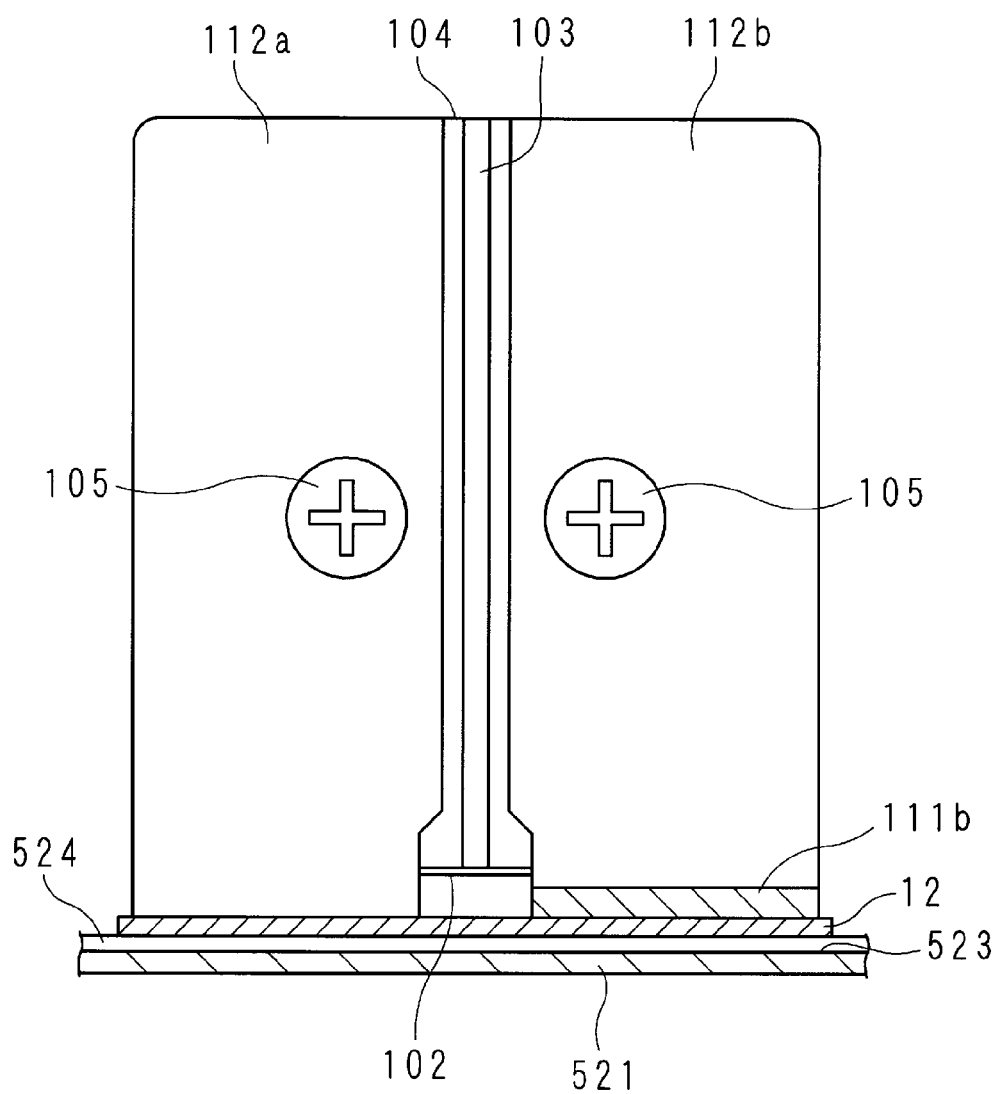
FIG. 8 is a cross-sectional view taken along a line VIII-VIII in FIG. 7.

FIG. 7 is an enlarged view of the round A portion shown with a broken line in FIG. 6, and FIG. 8 is a cross-sectional view taken along line VIII-VIII of FIG. 7.

The bus bar 11a includes a flat portion 111a that opposes the one surface 102 of the relay 10 and the inside surface 523 of the bottom plate 521, and comes in contact with the heat transfer sheet 12. Also, a contact portion 112a and a fixing portion 113a are provided respectively extending perpendicularly to the relay 10 side from two opposing edges of the flat portion 111a.

The contact portion 112a extends along the side surface 107 of the relay 10, and is provided with a through hole 114 in a substantially central portion thereof. By screwing a bolt 105 to the terminal 101 using the through hole 114, the contact portion 112a is fixed and electrically connected to the corresponding terminal 101. In other words, one end of the bolt 105 includes a retaining head portion, and by inserting the other end of the bolt 105 through the through hole 114 of the contact portion 112a and screwing it to the terminal 101 of the relay 10, the bus bar 11 is fixed to the terminal 101.

The fixing portion 113a is formed such that an end portion thereof is bent parallel to the bottom plate 521, and the end portion is provided with a through hole (see FIGS. 2 and 4). The fixing portion 113a is fixed to the inner side of the housing casing 50 using the through hole.

The bus bar 11b includes a flat portion 111b that opposes the inside surface 523 of the bottom plate 521 and that comes in contact with the heat transfer sheet 12. Also, a contact portion 112b and a fixing portion 113b are provided respectively extending perpendicularly toward the upper case 51 side from two opposing edges of the flat portion 111b.

The contact portion 112b extends along the side surface 107 of the relay 10, and is provided with a through hole in a substantially central portion thereof. By inserting a bolt 105 into the through hole and screwing it to the corresponding terminal 101, the contact portion 112b (bus bar 11b) is fixed and electrically connected to the terminal 101 (see FIG. 8).

Also, the fixing portion 113b is formed such that an end portion thereof is bent parallel to the bottom plate 521, and the end portion is provided with a through hole (see FIGS. 2 and 4). The fixing portion 113b is fixed to the inner side of the housing casing 50 using the through hole.

As described above, the heat transfer sheet 12 is interposed between the bus bar 11 and the inside surface 523. A plurality of first holding portions 524 that hold the bus bar 11 protrude from the inside surface 523 of the bottom plate 521 (see FIGS. 7 and 8). One surface of the transfer sheet 12 is in contact with the inside surface 523 (bottom plate 521) via the first holding portions 524, and the other surface is in contact with the bus bar 11.

Figure 9:
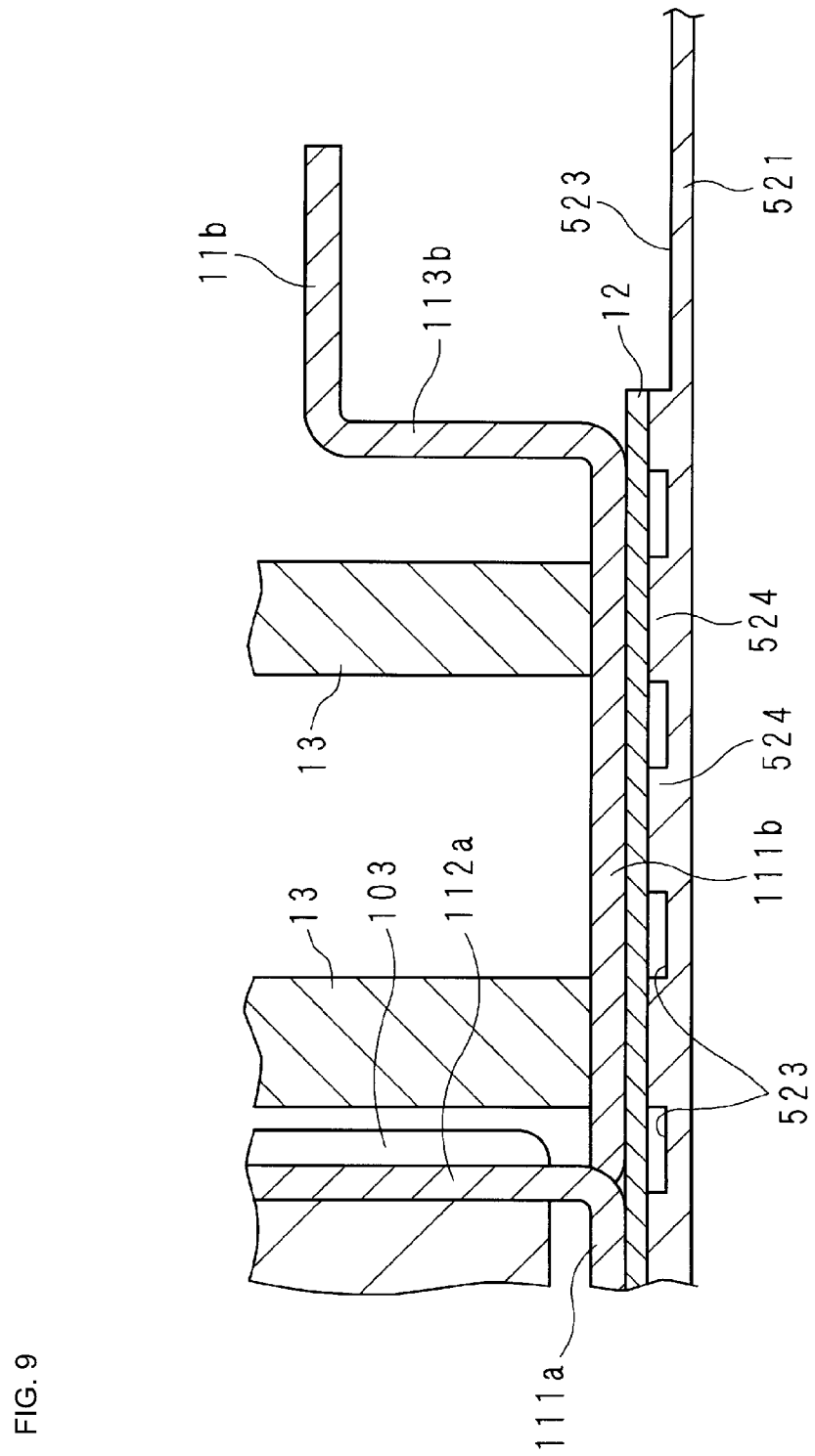
FIG. 9 is an enlarged view of a round B portion marked with a broken line in FIG. 6.

FIG. 9 is an enlarged view of the round B portion marked with a broken line in FIG. 6. As can be seen from FIGS. 8 and 9, the first holding portions 524 have a strip shape, and extend in the arrangement direction of the terminals 101 of the relay 10. The first holding portions 524 are arranged at equal intervals in a width direction, for example.

By employing such a configuration, in the electrical connection box 100 according to the present embodiment, heat generated by the relay 10 is swiftly transferred to the bus bars 11a and 11b via the bolts 105. Also, the heat is transferred to the heat transfer sheet 12 from the bus bars 11a and 11b, and further transferred to the bottom plate 521 of the lower case 52 via the first holding portions 524. The heat conducted to the bottom plate 521 is cooled via the outer surface, or cooled through predetermined cooling processing performed on the outer surface.

A second holding portion 13 that holds the bus bar 11 protrudes from the top surface 513 of the upper case 51. The second holding portion 13 is a frame body that extends in a direction that intersects with the top surface 513, that is, a direction in which the top surface 513 and the inside surface 523 oppose each other (hereinafter, simply referred to as the "opposing direction"), and presses the flat portion 111a of the bus bar 11a and the flat portion 111b of the bus bar 11b toward the bottom plate 521 (heat transfer sheet 12). For example, the second holding portion 13 is formed as one piece with the upper case 51, and when the electrical connection box 100 is fully assembled, the leading end of the second holding portion 13 is constantly in contact with the other surfaces of the flat portions 111a and 111b and constantly presses the bus bars 11a and 11b toward the bottom plate 521 (heat transfer sheet 12).

The second holding portion 13 includes tubular second holding portions 13A and a plate-shaped second holding portion 13B. In the second holding portion 13, the second holding portions 13A are arranged adjacent to each other and form a lattice-shaped leading end surface 132.

The second holding portion 13B extends from a side wall of one of the second holding portions 13A and forms a bent portion. The bent portion is bent about the opposing direction serving as an axis. In the second holding portion 13, the leading end surface 132 of the second holding portions 13A and the second holding portion 13B come into contact with the bus bars 11a and 11b.

As described above, in the electrical connection box 100 according to the present embodiment, the first holding portions 524 hold the bus bar 11 from the one surface side of the bus bar 11, via the heat transfer sheet 12, and the second holding portion 13 holds the bus bar 11 from the other surface side of the bus bar 11. That is, the first holding portions 524 and the second holding portion 13 push against each other via the bus bar 11, and thus warping of the bottom plate 521 can be suppressed. Accordingly, contact between the bus bar 11 and the heat transfer sheet 12 and contact between the heat transfer sheet 12 and the first holding portions 524 (bottom plate 521) can be ensured.

Also, in the electrical connection box 100 according to the present embodiment, the first holding portions 524 and the second holding portion 13 are provided at corresponding positions in the opposing direction (see FIGS. 6 and 9). In other words, the first holding portions 524 and the second holding portion 13 are provided so as to oppose each other in the opposing direction. Accordingly, warping of the bottom plate 521 is more reliably suppressed, and contact between the bus bar 11, the heat transfer sheet 12, and the first holding portions 524 (bottom plate 521) can be ensured.

Also, in the housing casing 50, at the portion occupied by the relay 10, that is, the portion not provided with the second holding portion 13 due to the arrangement of the relay 10, warping of the bottom plate 521 is suppressed by the relay 10 and the first holding portions 524.

In other words, in the electrical connection box 100 according to the present embodiment, the first holding portions 524 and the relay 10 are provided at corresponding positions in the opposing direction (see FIGS. 6 to 8). That is, the first holding portions 524 and the relay 10 are provided so as to oppose each other in the opposing direction. Also, as described above, the relay 10 is fixed to the top surface 513, and the contact portion 112a of the bus bar 11a is fixed to the side surface 107, while the flat portion 111a of the bus bar 11a is interposed between the one surface 102 of the relay 10 and the bottom plate 521. Accordingly, displacement of the flat portion 111a in the opposing direction is impaired by the relay 10, and thus the flat portion 111a holds down the bottom plate 521 via the first holding portions 524, thus suppressing warping. Accordingly, contact between the flat portion 111a, the heat transfer sheet 12, and the first holding portions 524 (bottom plate 521) can be ensured.

Furthermore, as described above, the relay 10 has a box shape, and includes two terminals 101 and the partition plate 103 on the side surface 107 that intersects the inside surface 523 of the bottom plate 521. That is to say, in the electrical connection box 100 according to the present embodiment, the one surface 102 of the relay 10 that opposes the flat portion 111a of the bus bar 11a does not include the terminals 101 or the partition plate 103.

Thus, the flat portion 111a need not be provided with a though hole for connection to a terminal 101 or a cut-out for avoiding collision with the partition plate 103. Accordingly, a reduction in the area of the flat portion 111a can be prevented, the flat part of the flat portion 111a can be maximized, and the flat portion 111a can restrain the bottom plate 521 in a uniform manner via the first holding portions 524. Accordingly, warping of the bottom plate 521 can be suppressed and contact between the flat portion 111a, the heat transfer sheet 12, and the first holding portions 524 (bottom plate 521) can be more reliably ensured.

Note that, as described above, the second holding portion 13 and the relay 10 hold down the bottom plate 521 via the bus bars 11a and 11b and the first holding portions 524, and thus contact between the bus bars 11a and 11b and the heat transfer sheet 12, and contact between the heat transfer sheet 12 and the bottom plate 521 can be more reliably maintained.

Also, in the electrical connection box 100 according to the present embodiment, as described above, the second holding portions 13A are tubular bodies, and thus the weight of the electrical connection box 100 can be further reduced.

The electrical connection box 100 according to the present embodiment is not limited to that described above. For example, the heat transfer sheet 12 may be constituted by a material that is not prone to deform, such as graphite or aluminum.

In this way, if the heat transfer sheet 12 is made of a material not prone to deform, compared to a case where a material that is prone to deformation is employed, the flat portion 111a of the bus bar 11a and the flat portion 111b of the bus bar 11b more swiftly and reliably transmit a force that restrains the bottom plate 521 to the bottom plate 521 via the heat transfer sheet 12, and thus warping of the bottom plate 521 can be more reliably suppressed.

Note that, a case in which the first holding portions 524 are arranged in the width direction thereof was described above, but the present disclosure is not limited to this. For example, the plurality of first holding portions 524 may be provided in a lattice form.

Embodiment 2

Figure 10:
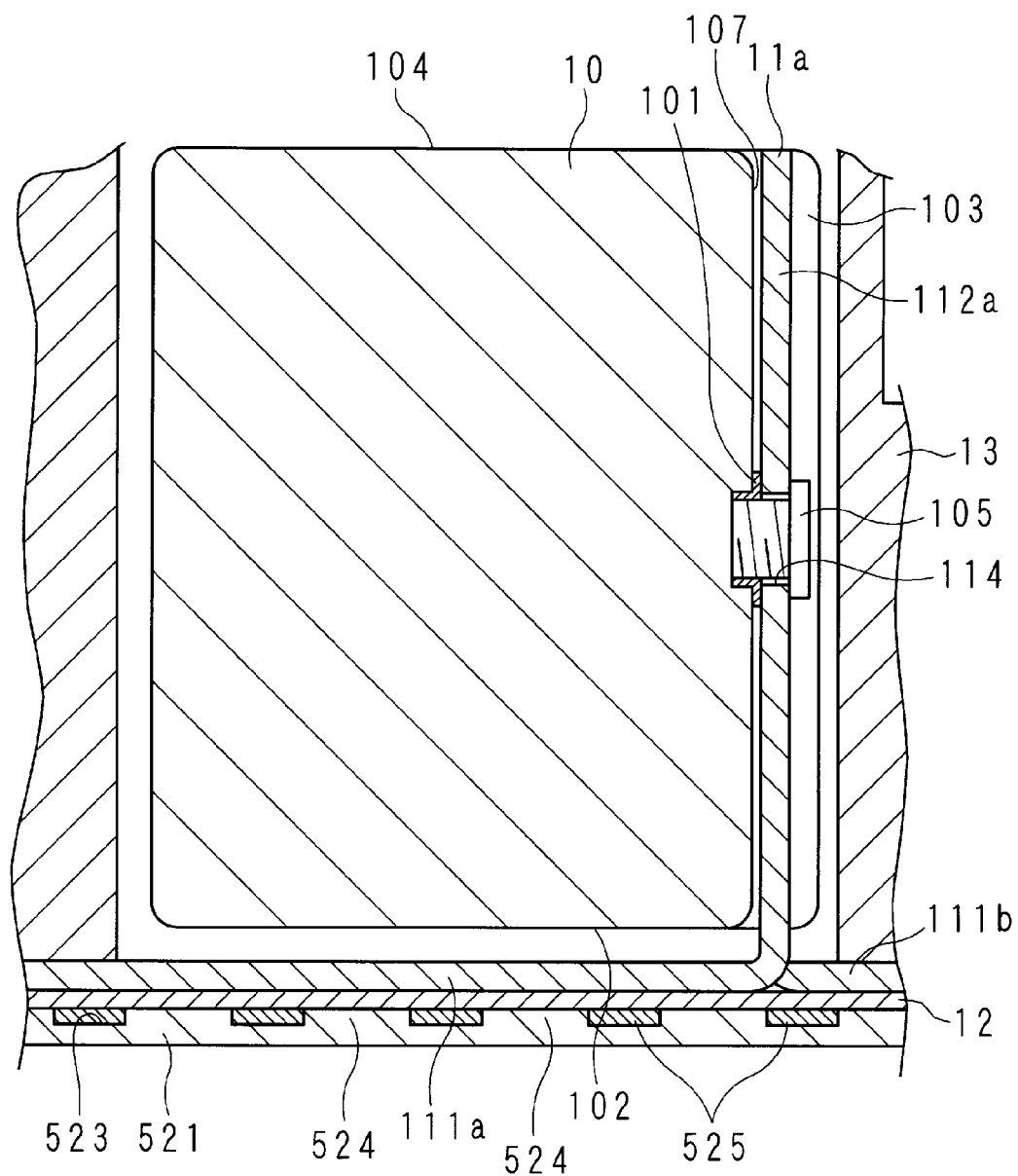
FIG. 10 is a cross-sectional view showing the positional relation between a relay, a bus bar, a heat transfer sheet, and a bottom plate in an electrical connection box according to Embodiment 2.

FIG. 10 is a cross-sectional diagram showing the positional relation between the relay 10, the bus bar 11, the heat transfer sheet 12, and the bottom plate 521, in the electrical connection box 100 of Embodiment 2.

The electrical connection box 100 according to Embodiment 2 includes the housing casing 50 constituted by the upper case 51 and the lower case 52, and the relay 10 is fixed to the upper case 51, and similar to Embodiment 1, the first holding portions 524 are formed on the bottom plate 521 of the lower case 52. The first holding portions 524 and the relay 10 are provided at corresponding positions in the opposing direction.

The bus bars 11a and 11b are connected to the relay 10. A detailed description of the shapes and locations of the bus bars 11a and 11b are omitted as they are same as those of Embodiment 1.

The contact portion 112a of the bus bar 11a is fixed to the side surface 107 of the relay 10, and the flat portion 111a of the bus bar 11a is interposed between the one surface 102 of the relay 10 and the bottom plate 521 (first holding portions 524). Also, the heat transfer sheet 12 is interposed between the flat portion 111a and the first holding portions 524, and the heat transfer sheet 12 is in contact with the flat portion 111a and the first holding portions 524.

Similar to Embodiment 1, the first holding portions 524 have a strip shape, and a plurality of the first holding portions 524 protrude from the inside surface 523. The first holding portions 524 are arranged at equal intervals in the width direction, for example. Thus, relatively recessed portions are formed between adjacent first holding portions 524.

In the electrical connection box 100 according to Embodiment 2, heat transfer members 525 are provided between adjacent first holding portions 524. The heat transfer members 525 are respectively disposed in the recessed portions formed between adjacent first holding portions 524, and are shaped to match the recessed portions. The heat transfer members 525 are sheet shaped and are deformable. The heat transfer members 525 may be silicone-based, non-silicone-based, ceramic-based, or carbon fiber-based, or may be rubber or grease with excellent heat transferring properties. The heat transfer members 525 are interposed between the heat transfer sheet 12 and the inside surface 523, and are in contact with the heat transfer sheet 12 and the inside surface 523. For example, by using heat transfer members 525 with a thickness slightly larger than the distance between the heat transfer sheet 12 and the inside surface 523, the heat transfer members 525 can remain in constant contact with both the heat transfer sheet 12 and the inside surface 523.

By employing a configuration such as that described above, in the electrical connection box 100 according to Embodiment 2, the flat portion 111a of the bus bar 11a and the flat portion 111b of the bus bar 11b hold down the bottom plate 521 via the first holding portions 524, and warping of the bottom plate 521 can be suppressed.

Furthermore, heat generated by the relay 10 and that has been transferred to the heat transfer sheet 12 via the bus bars 11a and 11b reaches the bottom plate 521 via the heat transfer members 525 as well as the first holding portions 524. Accordingly, heat generated by the relay 10 can be more efficiently dissipated.

Portions that are the same as those of Embodiment 1 are given the same reference numerals, and detailed description thereof will be omitted.

A case in which the relay 10 is fixed to the top surface 513, the second holding portion 13 protrudes from the top surface 513, and the first holding portions protrude from the inside surface 523 was described as an example above, but the present disclosure is not limited to this. A configuration may be employed in which the relay 10 is fixed to the inside surface 523, the second holding portion 13 protrudes from the inside surface 523, and the first holding portions protrude from the top surface 513.

The embodiments disclosed herein are to be considered illustrative in all respects and not restrictive. The scope of the present disclosure is defined by the claims and not by the meaning of the above description, and all changes that come within the meaning and range of equivalency of the claims are intended to be embraced therein.

The invention claimed is:

1. An electrical connection box including a housing casing for housing an electronic component, and a heat transfer sheet for transferring heat from the electronic component to the housing casing, the electrical connection box comprising:
    a bus bar provided between two opposing surfaces of the housing casing so as to oppose the two surfaces;
    a first holding portion protruding from a first surface of the two surfaces, and holding the bus bar via the heat transfer sheet; and
    a second holding portion protruding from a second surface of the two surfaces, and holding the bus bar.

2. The electrical connection box according to claim 1, wherein the electrical component is connected to the bus bar, and
    is attached to the second surface at a position corresponding to the first holding portion in an opposing direction in which the two surfaces oppose each other.

3. The electrical connection box according to claim 2, wherein the first holding portion and the second holding portion are provided at positions corresponding to each other in the opposing direction.

4. The electrical connection box according to claim 1, wherein the electronic component has a box shape and is provided with a terminal on one surface thereof, and
    the one surface intersects the first surface.

5. The electrical connection box according to claim 1, wherein the heat transfer sheet is made of one of graphite and aluminum.

6. The electrical connection box according to claim 5, further comprising:
    a deformable heat transfer member provided in a vicinity of the first holding portion and in contact with the heat transfer sheet and the first surface.

7. The electrical connection box according to claim 2, wherein the electronic component has a box shape and is provided with a terminal on one surface thereof, and
    the one surface intersects the first surface.

8. The electrical connection box according to claim 3, wherein the electronic component has a box shape and is provided with a terminal on one surface thereof, and
    the one surface intersects the first surface.

9. The electrical connection box according to claim 2, wherein the heat transfer sheet is made of one of graphite and aluminum.

10. The electrical connection box according to claim 3, wherein the heat transfer sheet is made of one of graphite and aluminum.

11. The electrical connection box according to claim 4, wherein the heat transfer sheet is made of one of graphite and aluminum.

* * * * *